United States Patent
Mochizuki

(10) Patent No.: US 12,402,468 B2
(45) Date of Patent: Aug. 26, 2025

(54) DETECTION DEVICE

(71) Applicant: Magnolia White Corporation, Tokyo (JP)

(72) Inventor: Kazuhide Mochizuki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 361 days.

(21) Appl. No.: 17/860,298

(22) Filed: Jul. 8, 2022

(65) Prior Publication Data

US 2023/0012698 A1  Jan. 19, 2023

(30) Foreign Application Priority Data

Jul. 13, 2021  (JP) ................. 2021-115990

(51) Int. Cl.
| | |
|---|---|
| *H10K 39/32* | (2023.01) |
| *G01J 1/44* | (2006.01) |
| *H05K 1/18* | (2006.01) |
| *H10K 77/10* | (2023.01) |

(52) U.S. Cl.
CPC ............... *H10K 39/32* (2023.02); *G01J 1/44* (2013.01); *H10K 77/111* (2023.02); *G01J 2001/446* (2013.01); *H05K 1/181* (2013.01); *H05K 1/189* (2013.01); *H05K 2201/10151* (2013.01)

(58) Field of Classification Search
CPC ......... H10K 39/32; H10K 77/111; G01J 1/44; G01J 2001/446; G01J 5/28; H05K 1/181; H05K 1/189; H05K 2201/10151
See application file for complete search history.

(56) References Cited

U.S. PATENT DOCUMENTS

| | | | |
|---|---|---|---|
| 6,690,493 B1 * | 2/2004 | Kobayashi | H04N 25/443 348/307 |
| 2001/0012070 A1 | 8/2001 | Enod et al. | |
| 2007/0210995 A1 * | 9/2007 | Ogura | G09G 3/3283 345/76 |
| 2013/0048864 A1 * | 2/2013 | Nakatsugawa | H01L 27/14663 156/60 |
| 2016/0037107 A1 * | 2/2016 | Sakaguchi | H01L 27/14621 348/294 |

(Continued)

FOREIGN PATENT DOCUMENTS

| | | |
|---|---|---|
| JP | H05-011301 U | 2/1993 |
| JP | H09-307698 A | 11/1997 |

(Continued)

OTHER PUBLICATIONS

Office Action issued in related Japanese Patent Application No. 2021-115990 mailed on Oct. 8, 2024 and English translation of same. 5 pages.

(Continued)

*Primary Examiner* — Georgia Y Epps
*Assistant Examiner* — Monica T Taba
(74) *Attorney, Agent, or Firm* — K&L Gates LLP

(57) ABSTRACT

According to an aspect, a detection device, includes a flexible substrate, a plurality of light sensors provided in a detection region of the flexible substrate, a terminal that is provided at one end of the flexible substrate and is capable of being coupled to an external device, and a peripheral circuit that is provided on the flexible substrate and located between the detection region and the terminal.

11 Claims, 7 Drawing Sheets

(56) References Cited

U.S. PATENT DOCUMENTS

2018/0337196 A1* 11/2018 Yang .................. H05K 1/189
2020/0400491 A1    12/2020 Tanaka et al.

FOREIGN PATENT DOCUMENTS

| JP | 2016-025187 A | 2/2016 |
| JP | 2016-164787 A | 9/2016 |
| JP | 2019-160826 A | 9/2019 |

OTHER PUBLICATIONS

Japanese Notice of Reasons for Refusal from corresponding Japanese Patent Application No. 2021-115990, mailed Mar. 11, 2025. 6 pages.

* cited by examiner

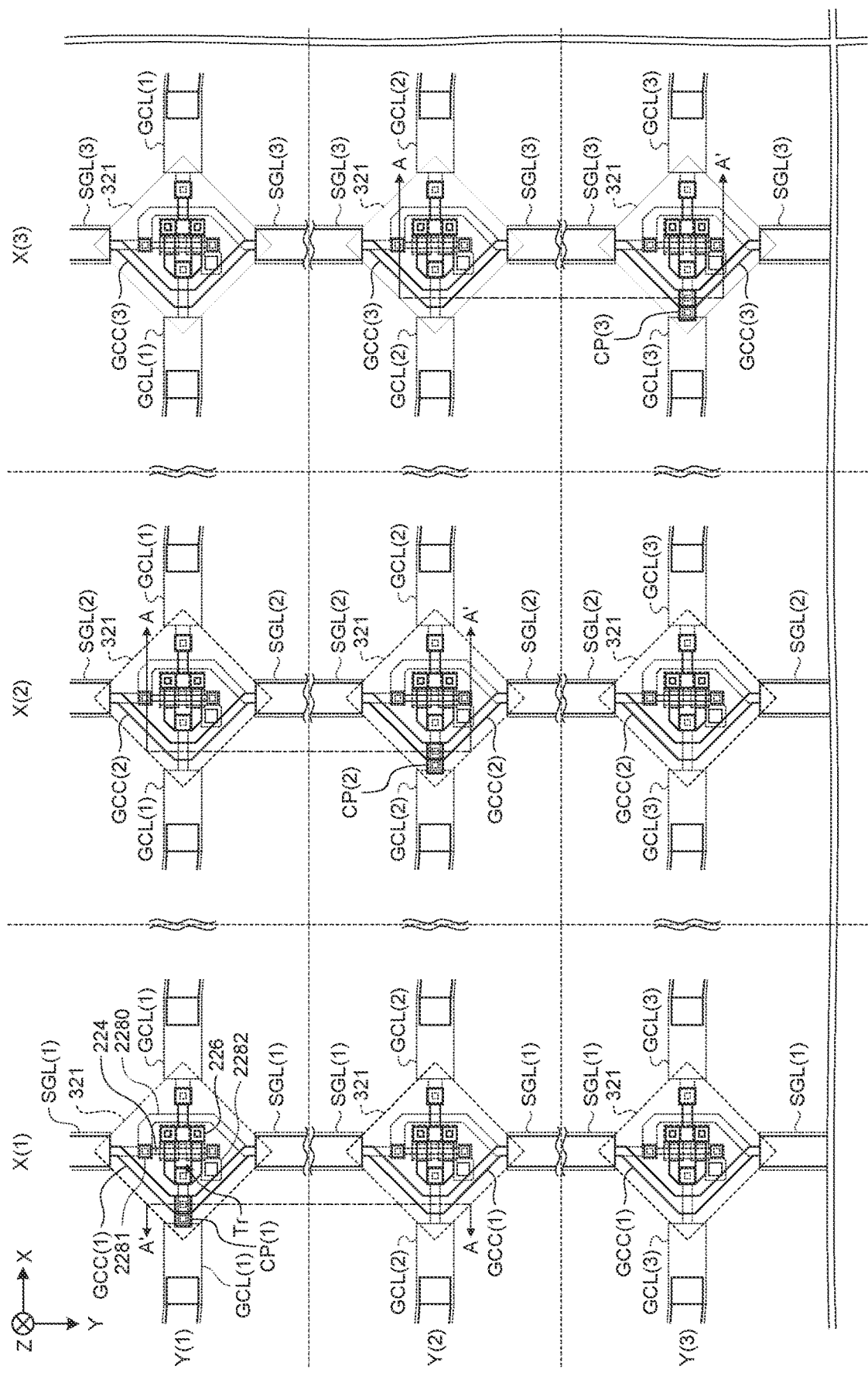

DETECTION DEVICE

CROSS-REFERENCE TO RELATED APPLICATION

This application claims the benefit of priority from Japanese Patent Application No. 2021-115990 filed on Jul. 13, 2021, the entire contents of which are incorporated herein by reference.

BACKGROUND

1. Technical Field

What is disclosed herein relates to a detection device.

2. Description of the Related Art

Detection devices are known that utilize a plurality of light sensors (optical sensors) to obtain two-dimensional light-dark patterns (e.g., Japanese Patent Application Laid-open Publication No. 2016-164787 (JP-A-2016-164787)).

The detection device described in JP-A-2016-164787 includes a received light signal readout circuit (optical signal readout circuit) that is coupled to a plurality of signal lines transmitting outputs from a plurality of light sensors, and a light receiving sensor operation circuit (optical sensor operation circuit) that operates switching elements interposed between the light sensors and the signal lines. The received light signal readout circuit is provided along one side of a rectangular-shaped detection region in which the light sensors are arranged. This structure has a high possibility of the received light signal readout circuit being damaged when the detection region is deformed in such a way that the detection region is curved or bent around a direction intersecting the one side and serving as the curvature or bending axis. The light receiving sensor operation circuit is provided along the other side of the rectangular-shaped detection region that is orthogonal to the one side along which the received light signal readout circuit is provided. This structure has a possibility of the light receiving sensor operation circuit being damaged when the detection region is deformed in such a way that the detection region is curved or bent around a direction intersecting the other side and serving as the curvature or bending axis. As described above, it is difficult for the detection device described in JP-A-2016-164787 to allow the detection region to be deformable.

For the foregoing reasons, there is a need for a detection device that allows the detection region to be more deformable.

SUMMARY

According to an aspect, a detection device, includes a flexible substrate, a plurality of light sensors provided in a detection region of the flexible substrate, a terminal that is provided at one end of the flexible substrate and is capable of being coupled to an external device, and a peripheral circuit that is provided on the flexible substrate and located between the detection region and the terminal.

BRIEF DESCRIPTION OF THE DRAWINGS

FIG. 5A is a plan view illustrating a positional relation between the signal line, the scanning line, and the coupling line near a switching element in an enlarged view region illustrated in FIG. 3;

DETAILED DESCRIPTION

Figure 1:
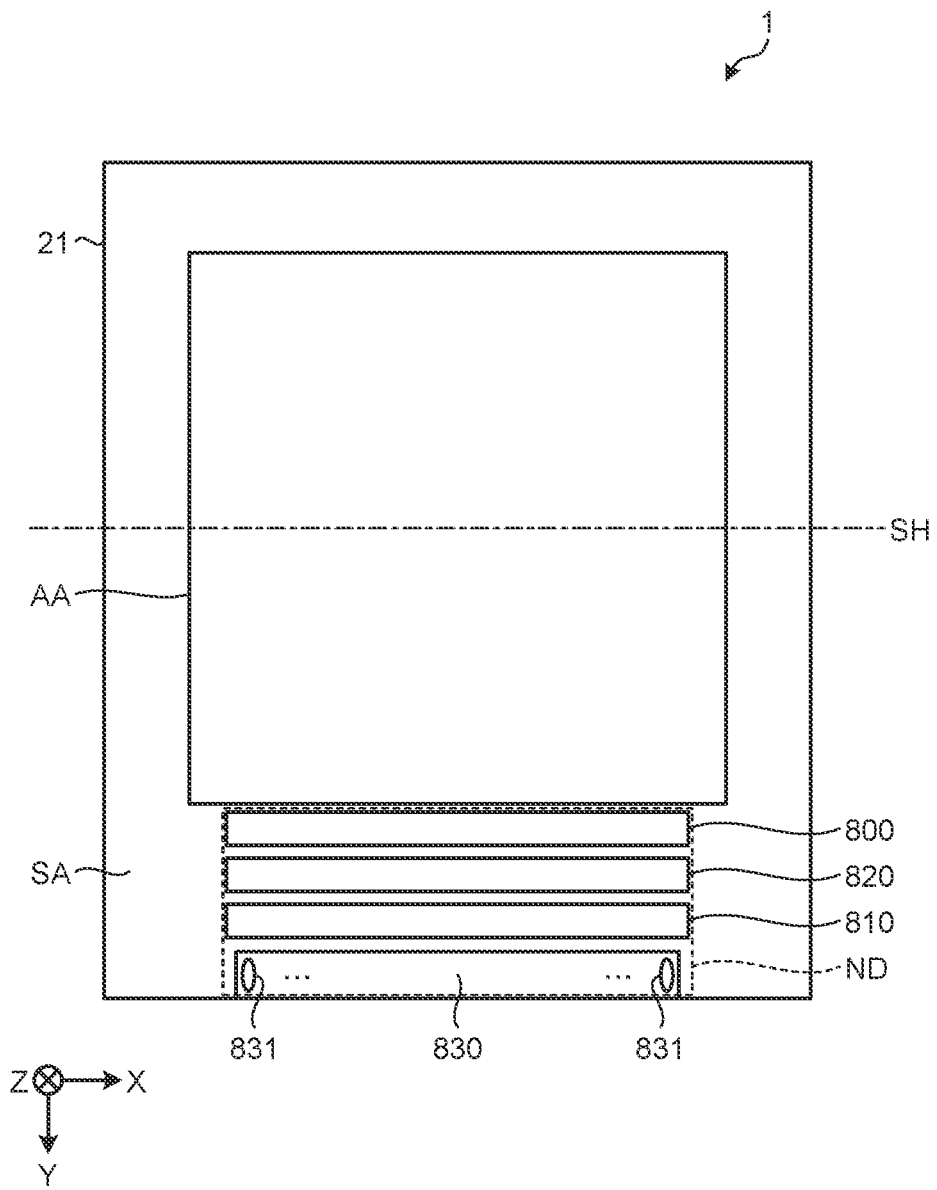
FIG. 1 is a schematic diagram illustrating a main structure of a detection device.

The following describes each embodiment of the present disclosure with reference to the accompanying drawings. The present disclosure is only an example, and any modification that can be easily conceived by a person skilled in the art while maintaining the main purpose of the invention is naturally included in the scope of the present disclosure. The width, thickness, shape, etc. of each part may be illustrated schematically in the drawings compared to the actual ones for the sake of clarity of explanation. Schematic illustrations are only examples and do not limit the interpretation of the present disclosure. In the present specification and in each figure, the same elements described in previous illustrated figures may be marked with the same symbols and detailed explanations may be omitted as appropriate.

In this disclosure, when an element is described as being "on" another element, the element can be directly on the other element, or there can be one or more elements between the element and the other element.

FIG. 1 is a schematic diagram illustrating a main structure of a detection device 1. The detection device 1 includes a flexible substrate 21, a plurality of photodiodes PD (refer to FIG. 2) provided in a detection region AA, a drive circuit 800, a selection circuit 810, a reset circuit 820, and a terminal region 830.

The flexible substrate 21 has flexibility. Specifically, the flexible substrate 21 is a flexible printed circuit (FPC), for example. The drive circuit 800 is what is called a gate driver. The drive circuit 800 includes a built-in shift register that sequentially shifts a target to which a signal is applied.

Figure 2:
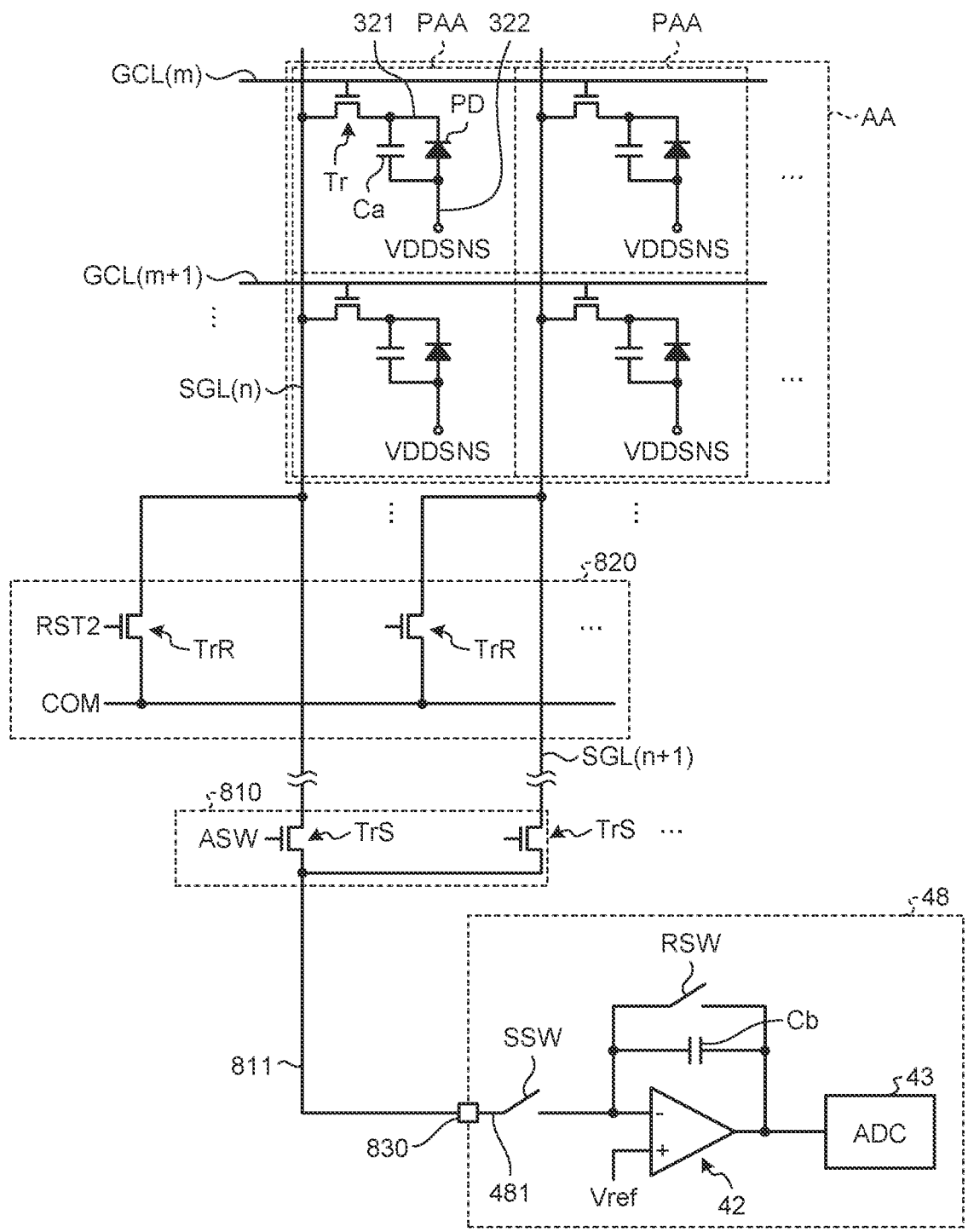
FIG. 2 is a circuit diagram illustrating a relation between a photodiode, a selection circuit, and a reset circuit.

FIG. 2 is a circuit diagram illustrating a relation between the photodiode PD, the selection circuit 810, and the reset circuit 820. An individual electrode 321 side of the photodiode PD functions as a cathode. A common electrode 322 side of the photodiode PD functions as an anode. The individual electrode 321 side may function as the anode while the common electrode 322 side may function as the cathode. In that case, a relation between a function (as an electron transport layer or a hole blocking layer) of a first buffer layer 37 described later and a function (as a hole transport layer or an electron blocking layer) of a second buffer layer 38 described later is also reversed. The photodiode PD is coupled to one of a source and a drain of a switching element Tr via an individual electrode 321. The photodiode PD is coupled in parallel to a capacitive element Ca, between the common electrode 322 and the one of the source and the drain of the switching element Tr.

The other of the source and the drain of the switching element Tr is coupled to a corresponding one of a plurality of signal lines SGL(n), SGL(n+1), and so on. Hereinafter, the signal line SGL denotes any of the signal lines SGL(n), SGL(n+1), and so on, unless otherwise noted. A gate of the switching element Tr is coupled to a corresponding one of a plurality of scanning lines GCL(m), GCL(m+1), and so on. Hereinafter, the scanning line GCL denotes any of the scanning lines GCL(m), GCL(m+1), and so on, unless otherwise noted. Note that m and n are natural numbers.

The electric power generated by the photodiode PD receiving light is stored in the capacitive element Ca coupled in parallel with the photodiode PD. When a drive signal is applied to the gate of the switching element Tr, the capacitive element Ca and the signal line SGL are coupled via the switching element Tr. The electric power that corresponds to the result of light detection performed by the photodiode PD until the drive signal is applied to the gate of the switching element Tr, is stored in the capacitive element Ca. When the drive signal is applied to the gate of the switching element Tr, a signal generated according to the electric power stored in the capacitive element Ca is therefore output via the switching element Tr and the signal line SGL. In this way, the photodiode PD functions as a light sensor (an optical sensor).

The selection circuit 810 can switch targets that are to be coupled to a detection circuit 48. Specifically, the selection circuit 810 has a plurality of switches TrS. One of the source and the drain of each of the switches TrS is coupled to a corresponding one of the signal lines SGL. The other of the source and the drain of each of the switches TrS is coupled to the detection circuit 48. Gates of the switches TrS are given an operation signal ASW at different timings. This allows the signal lines SGL to be coupled to the detection circuit 48 at different timings.

The detection circuit 48 is an analog front end (AFE) circuit, for example. The detection circuit 48 is a signal processing circuit that has at least the functions of a detection signal amplifier 42 and an analog-to-digital (A/D) converter 43. The detection signal amplifier 42 amplifies a detection signal Vdet. The A/D converter 43 converts an analog signal output from the detection signal amplifier 42 into a digital signal.

The detection circuit 48 is coupled to the signal line SGL when a switch SSW is turned on. The detection signal amplifier 42 of the detection circuit 48 converts a variation of a current supplied from the signal line SGL into a variation of a voltage and amplifies the voltage variation. A reference voltage Vref having a fixed potential is input into a non-inverting input terminal (+) of the detection signal amplifier 42 while the signal line SGL is coupled to an inverting input terminal (−) of the detection signal amplifier 42. In the embodiment, a signal having the same potential as that of a reset potential line COM, which is described later, is input as the reference voltage Vref. The detection signal amplifier 42 has a capacitive element Cb and a reset switch RSW. The charge of the capacitive element Cb in the detection circuit 48 is reset when the reset switch RSW is turned on. The operation of the detection circuit 48 is controlled by a host, which is described later.

Figure 3:
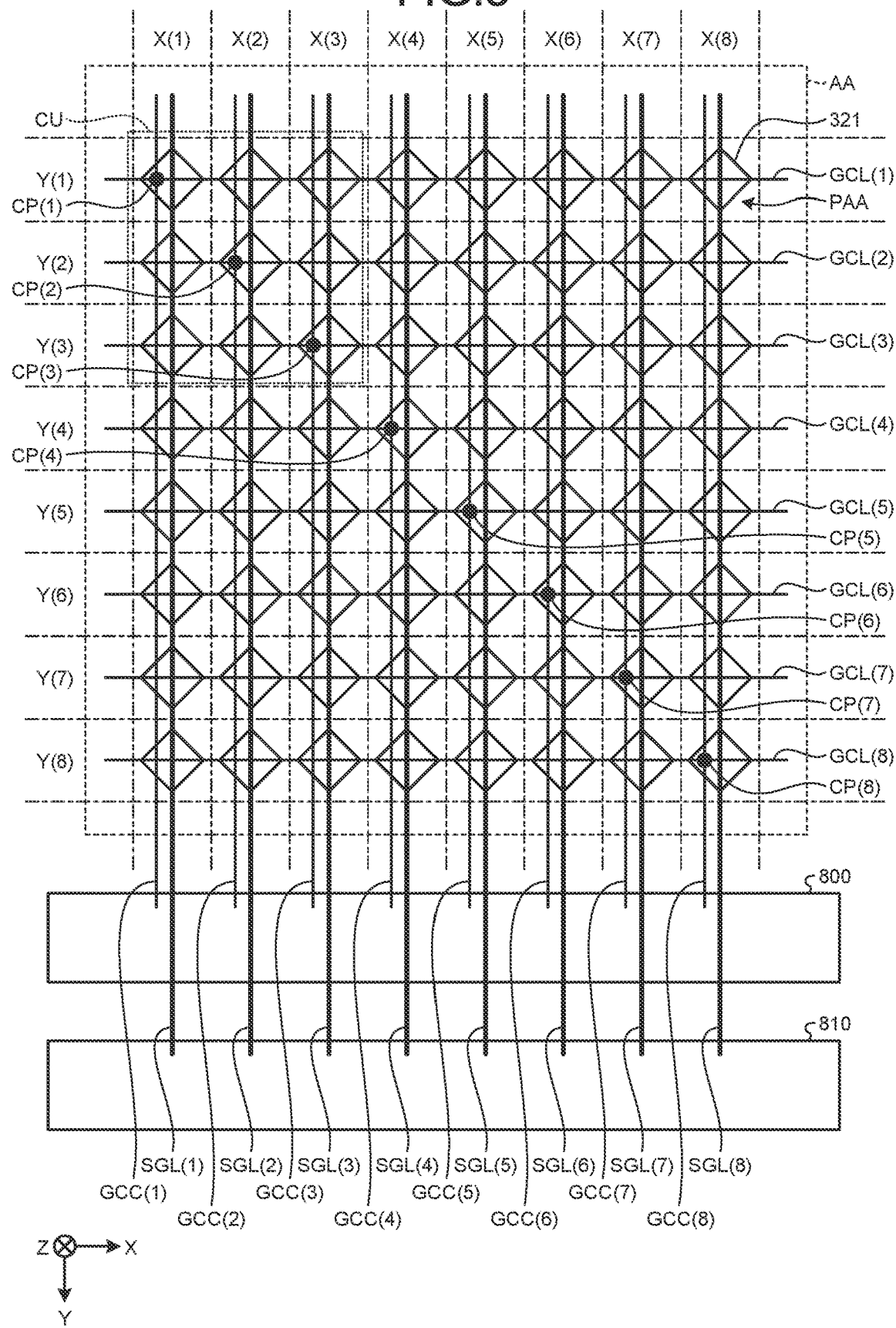
FIG. 3 is a schematic diagram illustrating a relation between coordinates of a plurality of partial detection regions included in a detection region, signal lines, scanning lines, and coupling lines.

As illustrated in FIGS. 2 and 3, the extending direction of the scanning lines GCL intersects that of the signal lines SGL. Each of the scan lines GCL is shared by the switching elements Tr aligned along the extending direction of the scan line GCL. Each of the signal lines SGL is shared by the switching elements Tr aligned along the extending direction of the signal line SGL. The switching elements Tr are arranged two-dimensionally along the extending directions of the scanning lines GCL and the signal lines SGL. The individual electrodes 321, the photodiodes PD, and the capacitive elements Ca, which are coupled to the switching elements Tr, are also two-dimensionally arranged in the same manner as the switching elements Tr. Hereinafter, the region including one of the switching elements Tr, the individual electrode 321, the photodiode PD, and the capacitive element Ca that are coupled to the one of the switching elements Tr is referred to as a partial detection region PAA. The output from the partial detection region PAA denotes the output from the capacitive element Ca included in the partial detection region PAA.

The switching elements Tr that share one of the scanning lines GCL do not share one of the signal lines SGL, but are respectively coupled to the different signal lines SGL. The switching elements Tr that share one of the signal lines SGL do not share one of the scanning lines GCL, but are respectively coupled to the different scanning lines GCL. As a result, the outputs from the different partial detection regions PAA are obtained through the signal lines SGL by applying the drive signal to the scanning lines GCL at different timings. The selection circuit 810 operates to switch the signal lines SGL to be coupled to the detection circuit 48. As a result, the outputs from the different partial detection regions PAA are sequentially supplied to the detection circuit 48.

The reset circuit 820 resets the potential of each of the signal lines SGL. Specifically, the reset circuit 820 has a plurality of switches TrR. One of the source and the drain of each of the switches TrR is coupled to a corresponding one of the signal lines SGL. In other words, the signal lines SGL are respectively coupled to the sources or the drains of the switches TrR. The other of the source and the drain of each of the switches TrR is coupled to the reset potential line COM. The reset potential line COM is given a reset potential. The reset potential resets the signal lines SGL after the outputs from the partial detection regions PAA is transmitted. The reset potential is ground potential, for example. The reset potential is not limited to the ground potential and may be any other potential predetermined according to the design of the detection device 1.

After the signal lines SGL are each coupled to the detection circuit 48 once by the selection circuit 810, the reset circuit 820 operates. Specifically, an operation signal RST2 is applied to the gates of the switches TrR of the reset circuit 820. This causes the signal lines SGL and the reset potential line COM to be coupled, thereby resetting the potentials of the signal lines SGL and the potentials of the capacitive elements Ca in the partial detection regions PAA including the switching elements coupled to the scanning line GCL to which the drive signal is applied.

The terminal region 830 allows the detection device 1 to be coupled to an external device (host). As illustrated in FIG. 1, terminals 831 are provided in the terminal region 830. In FIG. 1, more than one terminal is provided in the terminal region 830. The number of terminals 831 provided in the terminal region 830, however, may be one or more. In the embodiment of the present disclosure, the detection circuit 48 is provided in the host. The terminal region 830 is interposed between the selection circuit 810 and the detection circuit 48. At least one of the terminals 831 in the terminal region 830 is coupled to a wiring line 811 extending from the selection circuit 810. The specific standards for the shape and the like of the terminal region 830 correspond to the specific standards for a wiring line 481 extending from a switch SSW of the detection circuit 48.

The terminal region 830 may also include the terminals 831 of signal input lines coupled to the drive circuit 800, the selection circuit 810, and the reset circuit 820. Various signals such as the operation signal ASW and the operation signal RST2 are applied from the host via the signal input lines. When there is input and output of signals necessary for operation control of the detection device 1, the wiring lines for such input and output are also coupled to the terminals 831 in the terminal region 830 besides the signal input lines described above.

As illustrated in FIG. 1, the terminal region 830 is a part of the flexible substrate 21 and is provided at one end of a peripheral region SA that surrounds the detection region AA. The drive circuit 800, the selection circuit 810, and the reset circuit 820 are arranged between the detection region AA and the terminal region 830. As described above, the flexible substrate 21 has flexibility. In the flexible substrate 21, a part on the detection region AA side of the drive circuit 800 thus can be deformed, such as curved, to the extent that a non-deformation region ND provided with the drive circuit 800, the selection circuit 810, the reset circuit 820, and the terminal region 830 is not deformed. For example, a part of the flexible substrate 21 including the detection region AA can be deformed such that the detection region AA is rounded in a cylindrical shape around a deformation axis SH illustrated in FIG. 1.

The drive circuit 800 applies the drive signal to the scanning line GCL. The drive circuit 800 is coupled to the scanning line GCL via a coupling line GCC (refer to FIG. 3). The following describes the coupling between the drive circuit 800 and the scanning lines GCL via the coupling lines GCC with reference to FIG. 3.

FIG. 3 is a schematic diagram illustrating a relation between the coordinates of the partial detection regions PAA included in the detection region AA, the signal lines SGL, the scanning lines GCL, and the coupling lines GCC. In the explanation with reference to FIG. 3, 8×8 partial detection regions PAA arranged in a matrix having a row-column configuration are used as an example. The number and arrangement of partial detection regions PAA are not limited to those of the example and can be changed as appropriate. In the explanation with reference to FIG. 3, X(1), X(2), . . . , X(8) are added as the X coordinates along one of the alignment directions of the partial detection regions PAA. The X direction corresponds to the direction along the one of the alignment directions of the partial detection regions PAA. In the explanation with reference to FIG. 3, Y(1), Y(2), . . . , Y(8) are added as the Y coordinates along the other of the alignment directions of the partial detection regions PAA. The Y direction corresponds to the direction along the other of the alignment directions of the partial detection regions PAA. The Z direction is orthogonal to the X and Y directions.

When the position of a configuration (partial detection region PAA) is described in combination with the X and Y coordinates, it is represented as (X, Y)=(p, q). p and q are any natural numbers in a range from 1 to 8. When the number of partial detection regions PAA aligned in the X direction is natural number P that is not 8, p is any natural number in a range from 1 to P. When the number of partial detection regions PAA aligned in the Y direction is natural number Q that is not 8, then q is any natural number in a range from 1 to Q. For example, a configuration at (X, Y)=(1, 1) denotes a configuration at the position having the coordinates X(1) and Y(1).

As illustrated in FIG. 3, the signal line SGL is provided at each of the X coordinates. Specifically, the signal line SGL(p) is provided at the X coordinate of X(p) and extends in the Y direction. For example, the signal line SGL(1) is provided at the X coordinate of X(1). The partial detection regions PAA that have the same X coordinate and are aligned in the Y direction share the signal line SGL provided at the X coordinate. In other words, the switching elements Tr (refer to FIG. 2) included in the partial detection regions PAA having the X coordinate of X(p) share the signal line SGL(p).

As illustrated in FIG. 3, the scanning line GCL is provided at each of the Y coordinates. Specifically, the scanning line GCL(q) is provided at the Y coordinate of Y(q) and extends in the X direction. For example, the scanning line GCL(1) is provided at the Y coordinate of Y(1). The partial detection regions PAA that have the same Y coordinate and are aligned in the X direction share the scanning line GCL provided at the Y coordinate. In other words, the switching elements Tr (refer to FIG. 2) included in the partial detection regions PAA having the Y coordinate of Y(q) share the scanning line GCL(q).

As illustrated in FIG. 3, the drive circuit 800 is coupled to the scanning line GCL(q) via the coupling line GCC(q). The scanning line GCL(q) and the coupling line GCC(q) are coupled via a contact CP(q). For example, the scanning line GCL(1) and the coupling line GCC(1) are coupled via the contact CP(1). The scanning line GCL(1) and the drive circuit 800 are coupled via the coupling line GCC(1).

The coupling line GCC extends in the Y direction. In the example illustrated in FIG. 3, the number of partial detection regions PAA aligned in the X direction is equal to the number of partial detection regions PAA aligned in the Y direction. The coupling line GCC is thus provided at each of the X coordinates. In the example illustrated in FIG. 3, the coupling lines GCC(1), GCC(2), . . . , GCC(8) are exemplarily illustrated. As used herein, the coupling line GCC denotes any one of the coupling lines GCC(1), . . . , GCC(q).

The contact CP(q) illustrated in FIG. 3 couples the scanning line GCL(q) and the coupling line GCC(q) within the partial detection region PAA at (X, Y)=(q, q). Specifically, the contact CP(q) illustrated in FIG. 3 is provided at a position that overlaps with the individual electrode 321 included in the partial detection region PAA at (X, Y)=(q, q) in a plan view. The plan view is a view of the detection region AA viewed from the front. For example, the contact CP(1) is provided at a position that overlaps with the individual electrode 321 included in the partial detection region PAA at (X, Y)=(1, 1) in a plan view.

Figure 4:
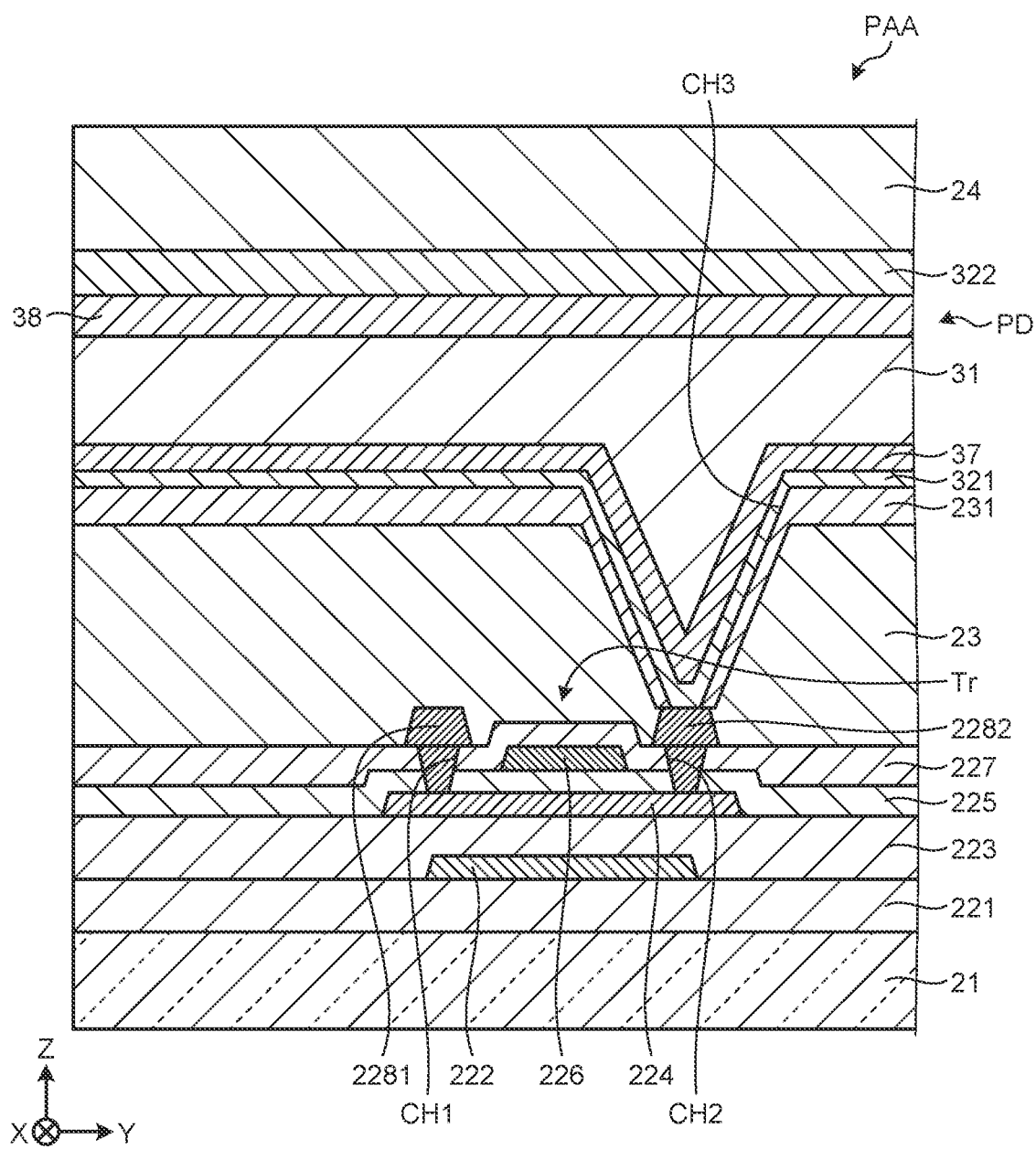
FIG. 4 is a schematic diagram illustrating a layered structure formed on one surface side of a flexible substrate.

The following describes a layered structure forming the photodiode PD and the switching element Tr that are provided in the partial detection region PAA with reference to FIG. 4.

FIG. 4 is a schematic diagram illustrating the layered structure formed on one surface side of the flexible substrate 21. An undercoat layer 221, a light-blocking metal 222, an undercoat layer 223, a semiconductor 224, a gate insulating film 225, a gate metal 226, an insulating film 227, a metal layer, a planarization film 23, a barrier layer 231, the individual electrode 321, the first buffer layer 37, a photoelectric conversion layer 31, the second buffer layer 38, the common electrode 322, and a sealing film 24 are layered in the Z direction on the one surface side of the flexible substrate 21 in this order from the flexible substrate 21.

The undercoat layers 221 and 223, the gate insulating film 225, the insulating film 227, the planarization film 23, and the sealing film 24 have an insulating property. As a result, no electrical conduction is established between elements that are separated by one of the undercoat layers 221 and 223, the gate insulating film 225, the insulating film 227, the planarization film 23, and the sealing film 24.

For a specific example of the films, the undercoat layers 221 and 223 are formed of an epoxy resin composition, for example, but may be inorganic films. The gate insulating film 225 and the insulating film 227 are insulating layers formed of a nitride such as silicon nitride, for example. The planarization film 23 is an organic planarization film formed of one of acrylic, polyimide, and polyacrylamide, for example. The sealing film 24 is formed using a polymer such as Parylene (registered trademark), for example.

The light-blocking metal 222 is located on the flexible substrate 21 side of the semiconductor 224 and has a light-blocking property. Most of light from the flexible substrate 21 side is blocked by the light-blocking metal 222 and hardly reaches the semiconductor 224. The undercoat layer 223 is interposed between the light-blocking metal 222 and the semiconductor 224.

The semiconductor 224 is interposed between the source and the drain of the switching element Tr. The gate metal 226 functions as the gate of the semiconductor 224. The gate insulating film 225 is interposed between the semiconductor 224 and the gate metal 226.

The metal layer includes SD metals 2281 and 2282. The SD metal 2281 is the other of the source and the drain of the switching element Tr and is coupled to the signal line SGL. The SD metal 2282 is the one of the source and the drain of the switching element Tr and is coupled to the individual electrode 321. The SD metal 2281 is formed to fill a contact hole CH1 formed in the gate insulating film 225 and the insulating film 227 and is coupled to the semiconductor 224. The SD metal 2282 is formed to fill a contact hole CH2 formed in the gate insulating film 225 and the insulating film 227 and is coupled to the semiconductor 224. The SD metals 2281 and 2282 are coupled via the semiconductor 224. The gate metal 226 is located between the SD metals 2281 and 2282 and is insulated from the SD metals 2281 and 2282 by the gate insulating film 225 and the insulating film 227.

The specific compositions of the semiconductor 224, the metal layer including the SD metals 2281 and 2282, and the gate metal 226 correspond to the semiconductor and wiring materials employed in the switching device Tr that functions as a thin film transistor (TFT). The semiconductor 224 is hydrogenated amorphous silicon (a-Si:H), for example. The metal layer is aluminum (Al), for example. The gate metal 226 is polysilicon or aluminum (Al). The compositions are not limited to these examples.

The individual electrode 321 is formed along the inner circumferential surface of a contact hole CH3 formed in the planarization film 23 and the barrier layer 231 that are layered on the SD metal 2282. The individual electrode 321 and the SD metal 2282 are coupled on the bottom of the contact hole CH3. The individual electrode 321 is disposed between the barrier layer 231 and the photoelectric conversion layer 31 and extends along the barrier layer 231 from the contact hole CH3. As illustrated in FIG. 3, the individual electrode 321 is provided for each partial detection region PAA. In other words, each of the photodiodes PD has the individual electrode 321.

The photoelectric conversion layer 31 changes its characteristics (e.g., a voltage-current characteristic and a resistance value) depending on received light. Organic materials are used as the material for the photoelectric conversion layer 31. Specifically, low molecular organic materials such as $C_{60}$ (fullerene), PCBM (phenyl $C_{61}$-butyric acid methyl ester), CuPc (copper phthalocyanine), $F_{16}$CuPc (fluorinated copper phthalocyanine), rubrene (5,6,11,12-tetraphenyltetracene), and/or PDI (a derivative of perylene) can be used for the photoelectric conversion layer 31.

The photoelectric conversion layer 31 can be formed using these low molecular organic materials by vapor deposition (dry process). In this case, the photoelectric conversion layer 31 may be a layered film of CuPc and $F_{16}$CuPc, or a layered film of rubrene and $C_{60}$, for example. The photoelectric conversion layer 31 can also be formed by coating (wet process). In this case, the photoelectric conversion layer 31 is made of a combination material of the low molecular organic materials described above and polymer organic materials. Examples of the usable polymer organic materials include P3HT (poly (3-hexylthiophene)) and F8BT (F8-alt-benzothiadiazole). The photoelectric conversion layer 31 can be a film of a mixture of P3HT and PCBM, or a film of a mixture of F8BT and PDI.

The first buffer layer 37 is formed to cover the individual electrode 321. The second buffer layer 38 is formed between the photoelectric conversion layer 31 and the common electrode 322. The first buffer layer 37 and the second buffer layer 38 are provided to facilitate the arrival of holes and electrons generated in the photoelectric conversion layer 31 at the common electrode 322 or the individual electrode 321. The first buffer layer 37 functions as an electron transport layer (hole blocking layer). The second buffer layer 38 functions as a hole transport layer (electron blocking layer).

Examples of usable material for the first buffer layer 37 include titanium oxide ($TiO_x$). Examples of usable material for the second buffer layer 38 include tungsten oxide ($WO_3$) and yttrium oxide ($Y_2O_3$). P3HT, which is one of the organic materials described above, is used for a p-type semiconductor layer 32, for example. PCBM, which is one of the organic materials described above, is used for an n-type semiconductor layer 33, for example.

The common electrode 322 is formed to cover the photoelectric conversion layer 31. The common electrode 322 covers the entire detection region AA in a plan view. In other words, the photodiodes PD share the common electrode 322. The sealing film 24 is formed to cover the common electrode 322. The sealing film 24 covers the entire detection region AA in a plan view.

The individual electrode 321 and the common electrode 322 face each other with the photoelectric conversion layer 31 therebetween. The photoelectric conversion layer 31 between the individual electrode 321 and the common electrode 322 generates a photovoltaic effect. The individual electrode 321, the common electrode 322, and the photoelectric conversion layer 31 in each partial detection region PAA thus function as the photodiode PD. The individual electrode 321 is made of a metal material, for example. Examples of the metal material include silver (Ag) and aluminum (Al). The individual electrode 321 may be an alloy material containing at least one or more of these metal materials. The common electrode 322 is made of a conductive material having translucency such as indium tin oxide (ITO), for example.

Figure 5B:
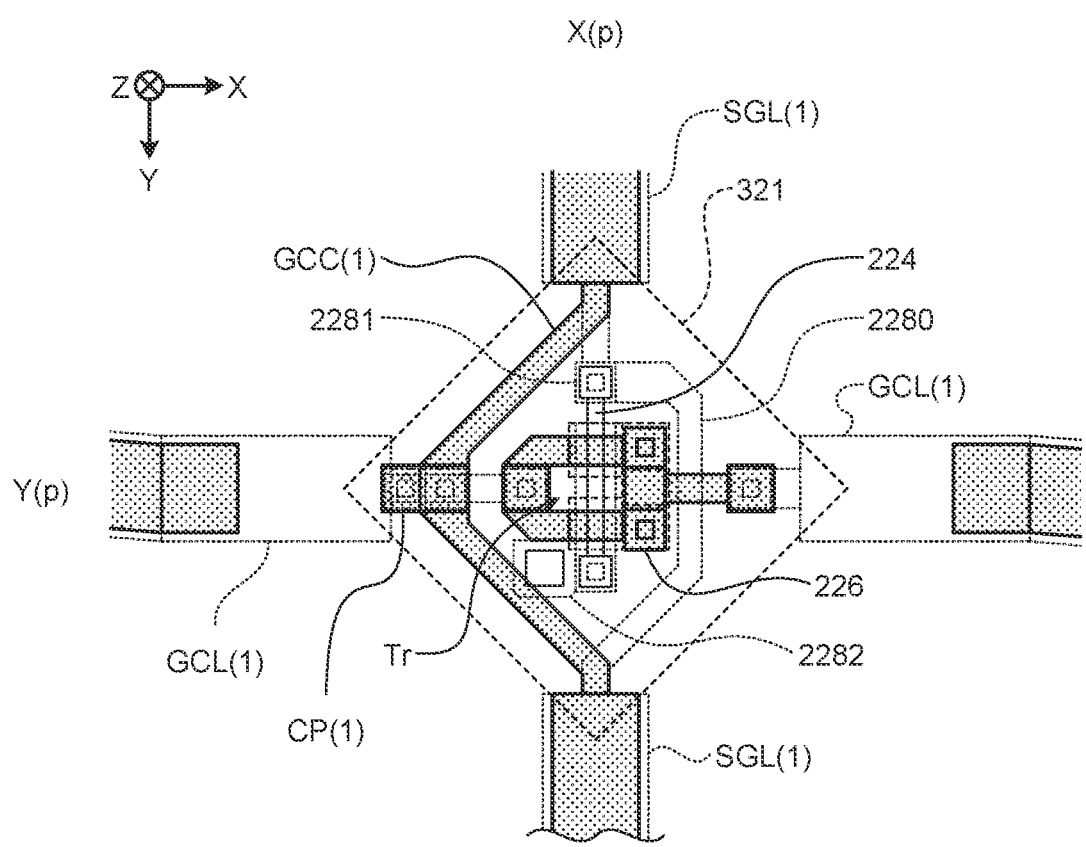
FIG. 5B is a further enlarged view of a configuration having an X coordinate of (p) and a Y coordinate of (p), which is the same coordinate value as the X coordinate, in 3×3 configurations illustrated in FIG. 5A.

The following describes a positional relation between the signal line SGL, the scanning line GCL, and the coupling line GCC near the switching element Tr, which is provided between the individual electrode 321 and the flexible substrate 21 in a plan view, with reference to FIGS. 5A and 5B.

FIG. 5A is a plan view illustrating the positional relation between the signal line SGL, the scanning line GCL, and the coupling line GCC near the switching element Tr in an enlarged viewing region CU illustrated in FIG. 3. FIG. 5B is a further enlarged view of the configuration having the X coordinate of (p) and the Y coordinate of (p), which is the same coordinate value as the X coordinate, in the 3×3 configurations illustrated in FIG. 5A. In FIG. 5B, the same dot pattern is added to the elements in the same layer as the gate metal 226. The following describes the positioning relation between the signal line SGL, the scanning line GCL, and the coupling line GCC near the switching element Tr by exemplifying those elements in the partial detection region PAA at (X, Y)=(1, 1). The same positional relation as described below is applied to the partial detection regions PAA at the positions having the other X and Y coordinates.

Separated portions of the scanning line GCL(1), each of which is illustrated by the dashed line in FIG. 5A, are coupled via the gate metal 226 on the flexible substrate 21 side of the individual electrode 321 in the partial detection region PAA at (X, Y)=(1, 1). More specifically, the metal layer formed as the scanning line GCL(1) is separated into the two portions in the X direction on the flexible substrate 21 side of the individual electrode 321. The two separated portions of the scanning line GCL(1) are coupled to each other via the gate metal 226 within the region overlapping with the individual electrode 321 in a plan view. It is described in a generalized manner that the separated portions of the scanning line GCL(q) are coupled to each other via the gate metal 226 on the flexible substrate 21 side of the individual electrode 321 in the configuration at (X, Y)=(p, q).

In the present disclosure, the metal layer in which the scanning line GCL(1) is formed is the same as the metal layer in which the SD metal 2281 is formed.

The signal line SGL(1), which is illustrated by the dashed line in FIG. 5A, is continuous via the SD metal 2281 and a detour 2280 on the flexible substrate 21 side of the individual electrode 321 in the configuration at (X, Y)=(1, 1). The detour 2280, which is illustrated by the dashed line, bends to detour the gate metal 226 in a plan view. The detour 2280 in the configuration at (X, Y)=(1, 1) extends from the Y coordinate of Y(2) side and detours the gate metal 226 to be coupled to the SD metal 2281 on the flexible substrate 21 side of the individual electrode 321 in the configuration at (X, Y)=(1, 1). In this way, the signal line SGL(1) is continuous at a position that does not overlap with the gate metal 226 in a plan view by passing the SD metal 2281 and the detour 2280. It is described in a generalized manner that the signal line SGL(p) is continuous via the SD metal 2281 and the detour 2280 on the flexible substrate 21 side of the individual electrode 321 in the configuration at (X, Y)=(p, q). The signal line SGL and the detour 2280 are formed in the same metal layer in which the SD metal 2281 is formed.

The SD metal 2282 is located at the position facing the semiconductor 224 with the gate metal 226 therebetween in a plan view on the flexible substrate 21 side of the individual electrode 321. As described with reference FIG. 4, the SD metal 2282 and the individual electrode 321 are coupled to each other.

The coupling line GCC(1), which is illustrated by the solid line in FIG. 5A, overlaps with the signal line SGL(1) outside the individual electrode 321 in a plan view. The coupling line GCC(1) bends on a side opposite to the detour 2280 with the gate metal 226 therebetween to detour the gate metal 226 in the individual electrode 321 in a plan view. As a result, the coupling line GCC is not contact with the gate metal 226. It is described in a generalized manner that the coupling line GCC(q) overlaps with the signal line SGL(q) outside the individual electrode 321 in a plan view. The coupling line GCC(q) bends on the side opposite to the detour 2280 with the gate metal 226 therebetween to detour the gate metal 226 in the individual electrode 321 in a plan view.

The coupling line GCC is formed in the same layer as the gate metal 226. As a result, the coupling line GCC in the present disclosure is formed on the flexible substrate 21 side of the metal layer in which the signal line SGL is formed. The scanning line GCL and the gate metal 226 are insulated from each other with the insulating film 227, and the coupling line GCC and the signal line SGL are insulated from each other with the insulating film 227.

Figure 6:
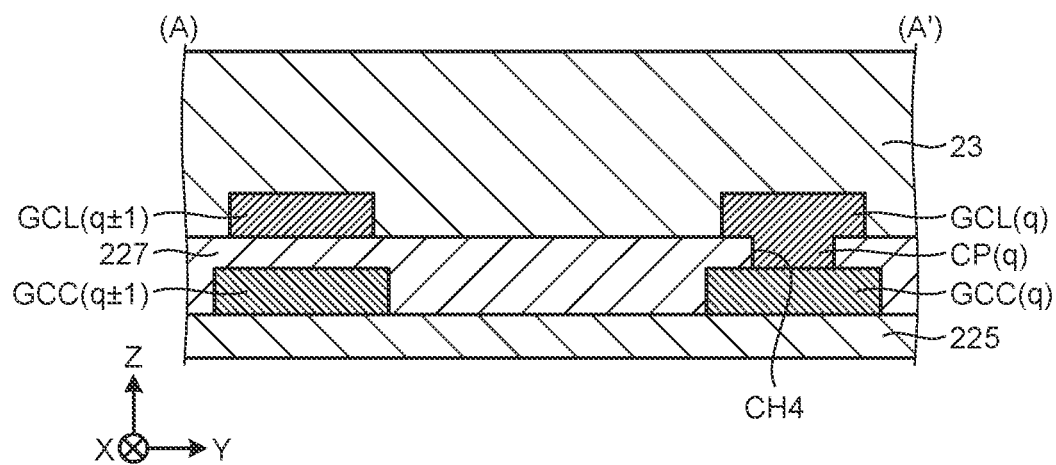
FIG. 6 is a cross-sectional view taken along line A-A' in FIG. 5A.

FIG. 6 is a cross-sectional view taken along line A-A' in FIG. 5A. As illustrated in FIG. 6, the contact CP(q) is formed to be continuous with the scanning line GCL(q) so as to fill a contact hole CH4 formed in the insulating film 227 covering the gate metal 226. More specifically, the contact holes CH4 are formed in the insulating film 227 at the positions of contacts CP(1), CP(2), and CP(3) that are illustrated in FIG. 5A. As an example, the position of the contact CP(1) illustrated in FIG. 5A is the position where the coupling line GCC(1) and the scanning line GCL(1) provided on the flexible substrate 21 side of the individual electrode 321 in the configuration at (X, Y)=(1, 1) intersect each other in a plan view. It is described in a generalized manner that the position of the contact CP(q) is the position where the coupling line GCC(q) and the scanning line GCL(q) provided on the flexible substrate 21 side of the individual electrode 321 in the configuration at (X, Y)=(q, q) intersect each other in a plan view. The scanning lines GCL(1), GCL(2), and GCL(3) and the contacts CP(1), CP(2), and CP(3) are formed by forming the scanning lines GCL(1), GCL(2), and GCL(3) such that these scanning lines overlap with the contact holes CH4. In the same manner as the contacts CP(1), CP(2), and CP(3), the contact CP(q) other than the contacts CP(1), CP(2), and CP(3) is also formed such that the coupling line GCC(q) and the scanning line GCL(q) are coupled at the position at which the coupling line GCC(q) and the scanning line GCL(q) intersect each other in a plan view on the flexible substrate 21 side of the individual electrode 321 in the configuration at (X, Y)=(q, q).

As illustrated in FIG. 6, the scanning line GCL(q+1) (or scanning line GCL(q−1)) is adjacent to the scanning line GCL(q) that overlaps with the position at which the contact CP(q) is formed in a plan view. The scanning line GCL(q+1) (or scanning line GCL(q−1)) is not coupled to the coupling line GCC(q+1) (or coupling line GCC(q−1)) at the x coordinate of X(q) at which the contact CP(q) is formed.

Figure 7:
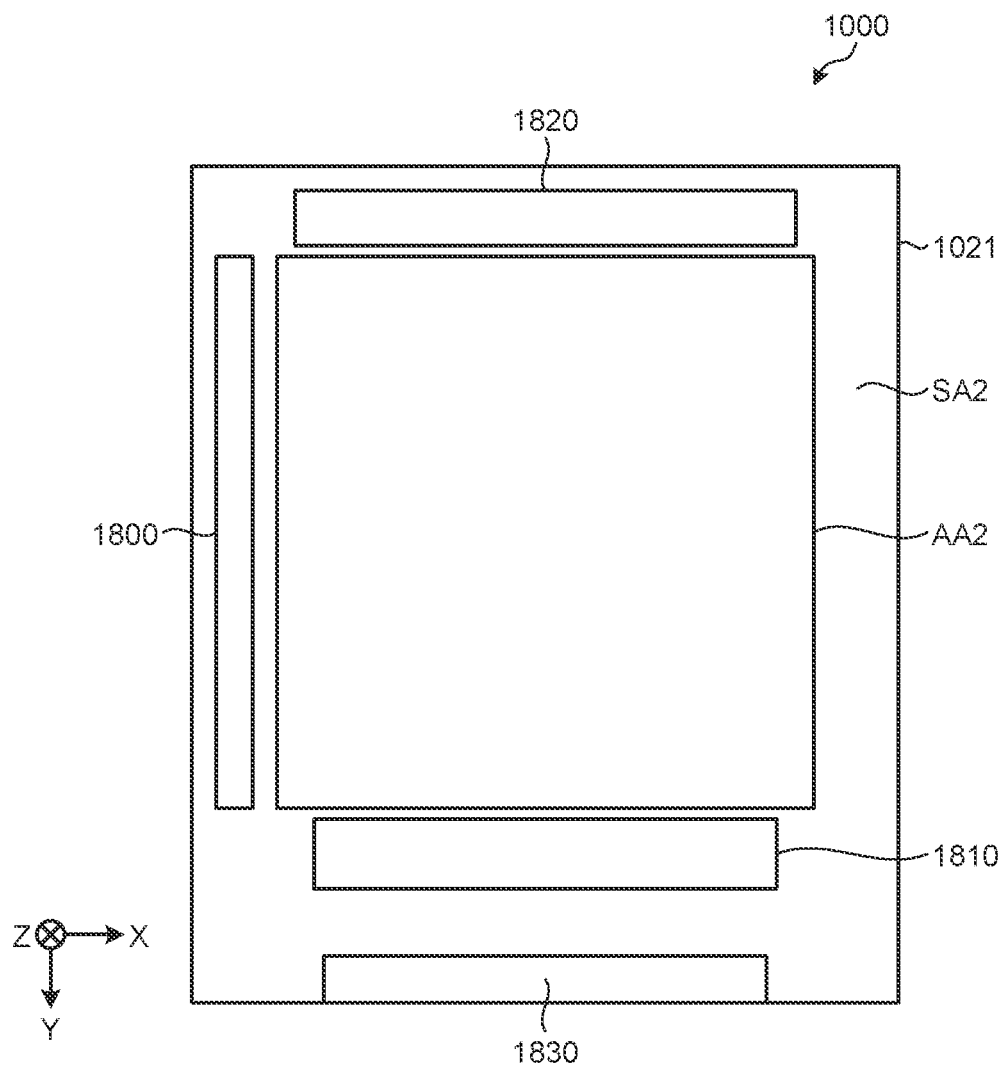
FIG. 7 is a schematic diagram illustrating a main structure of a conventional detection device.

FIG. 7 is a schematic diagram illustrating a main structure of a conventional detection device 1000. The detection device 1000 includes a substrate 1021, a detection region AA2, a drive circuit 1800, a selection circuit 1810, a reset circuit 1820, and a terminal region 1830. The substrate 1021 has the same structure as the flexible substrate 21. In the detection region AA2, the photodiodes PD, which are the same as the photodiodes PD provided in the detection region AA, are arranged two-dimensionally. The gate of the switching element coupled to the photodiode PD provided in the detection region AA2 is coupled to the drive circuit 1800 via the scanning line GCL, not via the three-dimensional coupling between the coupling line GCC and the scanning line GCL, which is described above. The drive circuit 1800 has the same structure as the drive circuit 800, except that the drive circuit 1800 is coupled directly to the scanning line GCL without the coupling line GCC and is provided at a position that is not between the detection region AA2 and the terminal region 1830. The selection circuit 1810 has the same structure as the selection circuit 810. The reset circuit 1820 has the same structure as the reset circuit 820, except that the reset circuit 1820 is provided at a position opposite the selection circuit 1810 with the detection region AA2 therebetween. The terminal region 1830 has the same structure as the terminal region 830.

As illustrated in FIG. 7, the drive circuit 1800 is provided along one of the two orthogonal sides of the rectangular-shaped detection region AA2 while the selection circuit 1810, the reset circuit 1820, and the terminal region 1830 are provided along the other side. It is difficult for this structure to deform the detection region AA2 even though the substrate 1021 has flexibility. Assuming that the detection region AA2 is deformed, any of the circuits including the drive circuit 1800, the selection circuit 1810, and the reset circuit 1820, and the interfaces including the terminal region 1830 may be damaged due to its mounting surface deformed in a curved shape as a result of the deformation of the detection region AA2. In contrast, the detection device 1 has more freedom of deformation within the range that does not affect the non-deforming region ND, as the example described above in which the detection device 1 is deformed in the cylindrical curvature around the deformation axis SH.

As described above, the detection device 1 according to the present disclosure includes: a flexible substrate (the flexible substrate 21); a plurality of light sensors (photodiodes PD) provided in a detection region (the detection region AA) of the flexible substrate; a terminal (the terminal 831) that is provided at one end of the flexible substrate and is capable of being coupled to an external device; and a peripheral circuit (including the drive circuit 800 and the selection circuit 810) that is provided on the flexible substrate and located between the detection region and the terminal.

With this structure, deformation of the detection region (detection region AA) does not affect the peripheral circuit (including the drive circuit 800, the selection circuit 810) and the terminal (the terminal 831) as long as the deformation interferes a region (e.g., the non-deforming region ND) between the detection region and the terminal. The present disclosure, thus, allows the detection region to be more deformable.

The peripheral circuit includes a selection circuit (the selection circuit 810) and a drive circuit (the drive circuit 800). The selection circuit is a circuit of which the coupling relations with a plurality of signal lines (the signal lines SGL) are switchable, and is configured to establish a transmission path with one of the signal lines. The signal lines are configured to transmit outputs from the light sensors (the photodiodes PD). The drive circuit (the drive circuit 800) applies a drive signal to gates of a plurality of switching elements (the switching elements Tr) interposed between the light sensors and the signal lines. This structure allows both making the detection region (the detection region AA) more easily deformable and providing the flexible substrate (the flexible substrate 21) with the selection circuit and the drive circuit that are necessary for operation of the light sensors.

The peripheral circuit further includes a reset circuit (the reset circuit 820) that is configured to reset the light sensors (photodiode PD). This structure allows both making the detection region (the detection region AA) more easily deformable and providing the reset circuit on the flexible substrate (the flexible substrate 21).

In the detection device 1, the selection circuit (the selection circuit 810), the drive circuit (the drive circuit 800), and the reset circuit (the reset circuit 820) are not provided at a position other than a position between the detection region (the detection region AA) and the terminal (the terminal 831) in a peripheral region (the peripheral region SA) of the flexible substrate (the flexible substrate 21). The peripheral region is located in a periphery of the detection region (detection region AA). This prevents a restriction on the deformation of the detection region that would occur when at least one of the selection circuit, the drive circuit, and the reset circuit is provided at a position other than the position between the detection region and the terminal. As a result, the detection region can be more deformable.

The detection device 1 further includes: a plurality of scanning lines (the scanning lines GCL) that are coupled to the gates of the switching elements (the switching elements Tr); and a plurality of coupling lines (the coupling lines GCC) that couple the scanning lines individually to the drive circuit (the drive circuit 800). The scanning line extends in one (the X direction) of alignment directions of the switching elements arranged in a matrix having a row-column configuration and is coupled to the gates of the switching elements aligned along the one of the alignment directions. The scanning lines are aligned in the other (the Y direction) of the alignment directions of the switching elements. The coupling line extends in the other of the alignment directions. The coupling lines are aligned in the one of the alignment directions. This makes it easier to place the drive circuit between the detection region (the detection region AA) and the terminal (terminal 831).

As illustrated in FIG. 3, one end of each of the coupling lines (the coupling lines GCC) is located farther from the drive circuit (the drive circuit 800) than a scanning line (the scanning line GCL(1)) furthest from the drive circuit among the scanning lines (the scanning lines GCL). This makes it easier to align all of the scanning lines between the drive circuit and the one end of each coupling line. As a result, the coupling lines can establish the coupling relation between the drive circuit and the scanning lines more reliably.

The signal lines (the signal lines SGL) and the coupling lines (the coupling lines GCC) overlap with each other while being insulated from each other within the detection region (the detection region AA). This makes it easier to complete the wiring of the signal line and the coupling line within the detection region. As a result, the peripheral region (the peripheral region SA) of the flexible substrate (the flexible substrate 21) can be made narrower.

The scanning lines (the scanning lines GCL) have intersections (the gate metals 226) that intersect the signal lines (the signal lines SGL) while being insulated from the signal lines, and a portion other than the intersections is formed in the same layer as the signal lines in the layered structure formed on the flexible substrate (the flexible substrate 21). This can further reduce the number of layers in the layered structure than the case where the portion of the scanning line excluding the intersection and the signal line are formed on different layers.

The light sensor (the photodiode PD) includes: a photoelectric conversion layer (the photoelectric conversion layer 31) that is configured to generate a photovoltaic effect; a buffer layer (the first buffer layer 37 or the second buffer layer 38) that is configured to facilitate transfer of electrons or holes generated in response to electric power generated in the photoelectric conversion layer; and two electrodes (the individual electrode 321 and the common electrode 322) that abut the photoelectric conversion layer via the buffer layer and face each other with the photoelectric conversion layer therebetween. One (the individual electrode 321) of the two electrodes overlaps with the intersection (the gate metal 226) while being isolated from the intersection. With this configuration, the light sensor and the intersection (the gate metal 226) of the scanning line (the scanning line GCL) with the signal line (the signal line SGL) can be arranged such that they overlap with each other three-dimensionally. This makes it easier to complete the wiring of the scanning lines and the signal lines within the detection region (the detection region AA). Consequentially, the peripheral region (the peripheral region SA) of the flexible substrate (the flexible substrate 21) can be made narrower.

The reset circuit 820 need not be formed on the flexible substrate 21. For example, the reset circuit 820 may be provided in the host and coupled via the terminal 831 to the detection device 1 that includes no reset circuit 820.

In the above description, P and Q are both equal to 8, but P and Q need not be equal, or at least one of them can be any other natural number that is not 8. When P is greater than Q, some of the signal lines SGL do not overlap with the coupling line GCC. When P is less than Q, some of the coupling lines GCC do not overlap with the signal line SGL.

It is also understood that any other effects that are obvious from the description of the specification or that can be conceived of by those skilled in the art are naturally brought about by the present disclosure.

What is claimed is:

1. A detection device, comprising:
a flexible substrate;
a plurality of light sensors provided in a detection region of the flexible substrate;
a plurality of switching elements each having a source, a gate, and a drain;
a terminal that is provided at one end of the flexible substrate and is capable of being coupled to an external device;
a drive circuit; and
a peripheral circuit that is provided on the flexible substrate and located between the detection region and the terminal, wherein
one of the source and the drain of each of the switching elements is coupled to a corresponding one of the light sensors,
the gate of each of the switching elements is coupled to corresponding one of a plurality of scanning lines each extending in a direction, the scanning lines being arranged in other direction,
each of a plurality of coupling lines is coupled to a corresponding one of the scanning lines, the coupling lines each extending in the other direction, the coupling lines being arranged in the direction,
other one of the source and the drain of each of the switching elements is coupled to a corresponding one of a plurality of signal lines each extending in the other direction, the signal lines being arranged in the direction,
the coupling lines and the scanning lines are coupled to the peripheral circuit, and
one end of each of the coupling lines is located farther from the drive circuit than a scanning line farthest from the drive circuit among the scanning lines.

2. The detection device according to claim 1, wherein the peripheral circuit includes:
a selection circuit that is a circuit of which coupling relations with the signal lines are switchable and that is configured to establish a transmission path with one of the signal lines, the signal lines being configured to transmit outputs from the light sensors; and
the drive circuit that is configured to apply a drive signal to gates of the switching elements interposed between the light sensors and the signal lines.

3. The detection device according to claim 2, wherein the peripheral circuit includes a reset circuit that is configured to reset the light sensors.

4. A detection device, comprising:
a flexible substrate;
a plurality of light sensors provided in a detection region of the flexible substrate;
a terminal that is provided at one end of the flexible substrate and is capable of being coupled to an external device; and
a peripheral circuit that is provided on the flexible substrate and located between the detection region and the terminal, wherein
the peripheral circuit includes:
a selection circuit that is a circuit of which coupling relations with a plurality of signal lines are switchable and that is configured to establish a transmission path with one of the signal lines, the signal lines being configured to transmit outputs from the light sensors;
a drive circuit that is configured to apply a drive signal to gates of a plurality of switching elements interposed between the light sensors and the signal lines; and
a reset circuit that is configured to reset the light sensors, and
the selection circuit, the drive circuit, and the reset circuit are not provided at a position other than a position between the detection region and the terminal in a peripheral region of the flexible substrate, the peripheral region being located in a periphery of the detection region.

5. A detection device, comprising:
a flexible substrate;
a plurality of light sensors provided in a detection region of the flexible substrate;
a plurality of switching elements each having a source, a gate, and a drain;
a terminal that is provided at one end of the flexible substrate and is capable of being coupled to an external device;
a drive circuit; and
a peripheral circuit that is provided on the flexible substrate and located between the detection region and the terminal, wherein
one of the source and the drain of each of the switching elements is coupled to a corresponding one of the light sensors,
the gate of each of the switching elements is coupled to corresponding one of a plurality of scanning lines each extending in a direction, the scanning lines being arranged in other direction,
each of a plurality of coupling lines is coupled to a corresponding one of the scanning lines, the coupling lines each extending in the other direction, the coupling lines being arranged in the direction,
other one of the source and the drain of each of the switching elements is coupled to a corresponding one of a plurality of signal lines each extending in the other direction, the signal lines being arranged in the direction,
the coupling lines and the scanning lines are coupled to the peripheral circuit, and the signal lines and the coupling lines overlap with each other while being isolated from each other within the detection region.

6. The detection device according to claim 5, wherein the peripheral circuit includes:
   a selection circuit that is a circuit of which coupling relations with the signal lines are switchable and that is configured to establish a transmission path with one of the signal lines, the signal lines being configured to transmit outputs from the light sensors; and
   a drive circuit that is configured to apply a drive signal to gates of the switching elements interposed between the light sensors and the signal lines.

7. The detection device according to claim 6, wherein the peripheral circuit includes a reset circuit that is configured to reset the light sensors.

8. A detection device, comprising:
   a flexible substrate;
   a plurality of light sensors provided in a detection region of the flexible substrate;
   a plurality of switching elements each having a source, a gate, and a drain;
   a terminal that is provided at one end of the flexible substrate and is capable of being coupled to an external device;
   a drive circuit; and
   a peripheral circuit that is provided on the flexible substrate and located between the detection region and the terminal, wherein
   one of the source and the drain of each of the switching elements is coupled to a corresponding one of the light sensors,
   the gate of each of the switching elements is coupled to corresponding one of a plurality of scanning lines each extending in a direction, the scanning lines being arranged in other direction,
   each of a plurality of coupling lines is coupled to a corresponding one of the scanning lines, the coupling lines each extending in the other direction, the coupling lines being arranged in the direction,
   other one of the source and the drain of each of the switching elements is coupled to a corresponding one of a plurality of signal lines each extending in the other direction, the signal lines being arranged in the direction,
   the coupling lines and the scanning lines are coupled to the peripheral circuit,
   the scanning lines have intersections that intersect the signal lines while being insulated from the signal lines, and
   a portion other than the intersections is formed in the same layer as the signal lines in a layered structure formed on the flexible substrate.

9. The detection device according to claim 8, wherein each of the light sensors includes:
   a photoelectric conversion layer that is configured to generate a photovoltaic effect;
   a buffer layer that is configured to facilitate transfer of electrons or holes generated in response to electric power generated in the photoelectric conversion layer; and
   two electrodes that abut the photoelectric conversion layer via the buffer layer and face each other with the photoelectric conversion layer therebetween, and
   one of the two electrodes overlaps with a corresponding one of the intersections while being isolated from the intersections.

10. The detection device according to claim 8, wherein the peripheral circuit includes:
    a selection circuit that is a circuit of which coupling relations with the signal lines are switchable and that is configured to establish a transmission path with one of the signal lines, the signal lines being configured to transmit outputs from the light sensors; and
    a drive circuit that is configured to apply a drive signal to gates of the switching elements interposed between the light sensors and the signal lines.

11. The detection device according to claim 10, wherein the peripheral circuit includes a reset circuit that is configured to reset the light sensors.

* * * * *